(12) United States Patent
Cavegn et al.

(10) Patent No.: US 12,710,448 B2
(45) Date of Patent: Aug. 18, 2026

(54) REPLACEABLE INSULATOR COLLARS FOR SEMICONDUCTOR TEST SYSTEMS

(71) Applicant: XCERRA CORPORATION, Norwood, MA (US)

(72) Inventors: Martin Cavegn, Lino Lakes, MN (US); Abdullahi Mohamud, St. Paul, MN (US); Rahul Patekar, St. Paul, MN (US); Jason Mroczkowski, Stillwater, MN (US)

(73) Assignee: Xcerra Corporation, Norwood, MA (US)

( * ) Notice: Subject to any disclaimer, the term of this patent is extended or adjusted under 35 U.S.C. 154(b) by 187 days.

(21) Appl. No.: 18/636,094

(22) Filed: Apr. 15, 2024

(65) Prior Publication Data

US 2025/0321247 A1 Oct. 16, 2025

(51) Int. Cl.
*G01R 1/04* (2006.01)
*G01R 1/067* (2006.01)
*G01R 3/00* (2006.01)

(52) U.S. Cl.
CPC ....... *G01R 1/0491* (2013.01); *G01R 1/06733* (2013.01); *G01R 3/00* (2013.01)

(58) Field of Classification Search
CPC .... G01R 1/0491; G01R 1/06733; G01R 3/00; G01R 1/07314
See application file for complete search history.

(56) References Cited

U.S. PATENT DOCUMENTS

2024/0377433 A1* 11/2024 Zhou .................. G01R 1/06722

FOREIGN PATENT DOCUMENTS

WO WO-2023049433 A1 * 3/2023 ............... G01R 3/00

* cited by examiner

*Primary Examiner* — G. M. A Hyder
(74) *Attorney, Agent, or Firm* — Knobbe, Martens, Olson & Bear, LLP

(57) ABSTRACT

A retained and removable signal probe collar is disclosed. A contactor is disclosed. The contactor includes a metal substrate having a probe hole and a removable signal probe collar located in the probe hole. The removable signal probe collar has a removable signal probe collar hole. A signal probe is located in the removable probe collar hole. A method for retrofitting a contactor with a removable signal probe collar is disclosed.

19 Claims, 13 Drawing Sheets

REPLACEABLE INSULATOR COLLARS FOR SEMICONDUCTOR TEST SYSTEMS

FIELD

The present disclosure relates to semiconductor test systems. In particular, the disclosure relates to removable, and retained, insulator collars used in a semiconductor test system contactor.

BACKGROUND

Current contactors used in testing semiconductor devices can include insulators that are integrated with the contactor body and therefore difficult to replace. Other types of contactors may not be integrated with a contactor body, and therefore can dislodge when components become separated. Further, the insulators in current contactors allow for cross-talk between probes. One example of a current contactor having an injection molded dielectric sleeve mated to the contactor can be found in U.S. Application No. 2022/0043029, published on Feb. 10, 2022.

SUMMARY

Consistent with disclosed embodiments, a removable signal probe collar for use in a contactor is disclosed. The removable signal probe collar includes a substantially cylindrical substrate having a cylinder axis. The substantially cylindrical substrate has a hole substantially aligned with the cylinder axis. The substantially cylindrical substrate includes a probe alignment aperture that aligns the signal probe to be centered within the signal probe collar.

In some embodiments, the removable signal probe collar further includes a retention structure. In some embodiments, the retention structure comprises a snap-in retention structure. In some embodiments, the cylindrical substrate has a height of between about 0.4 millimeters and about 1.5 millimeters.

Consistent with disclosed embodiments, a removable signal probe collar for use in a contactor is disclosed. A substantially cylindrical substrate has a cylinder axis. The substantially cylindrical substrate has a hole substantially aligned with the cylinder axis. A retention structure is included in the substantially cylindrical substrate.

In some embodiments, the retention structure includes a spring retention feature including a retention hook. In some embodiments, the spring retention feature is aligned substantially parallel to the cylinder axis. In some embodiments, the retention hook includes a sloped surface. In some embodiments, the substantially cylindrical substrate has a proximal end and a distal end. The proximal end includes a probe aperture included in the hole. The probe alignment aperture enables alignment of a probe to a contact site of a device under test. In some embodiments, the probe is aligned to the center of the probe aperture. In some embodiments, the removable signal probe collar further includes a ledge formed on the cylindrical substrate. Consistent with disclosed embodiments, a contactor is disclosed.

The contactor includes a metal substrate, a removable signal probe collar, and a signal probe. The metal substrate has a probe hole. The removable signal probe collar is located in the probe hole. The removable signal probe collar has a removable signal probe collar hole. The signal probe is located in the removable signal probe collar hole. In some embodiments, the removable signal probe collar has a proximal end and a distal end. The proximal end includes a signal probe alignment aperture. The signal probe alignment aperture enables alignment of the signal probe to a contact site of a device under test. In some embodiments, the signal probe alignment aperture has a diameter substantially equal to a diameter of a metal sphere of a ball grid array. In some embodiments, the removable signal probe collar includes a snap-in removable signal probe collar. In some embodiments, the snap-in signal probe collar includes a spring retention feature including a retention hook. In some embodiments, the spring retention feature includes a surface that is back cut to substantially prevent the spring retention feature from binding the signal probe when the spring retention feature is partially deflected.

Consistent with the disclosed embodiments, in some embodiments, the contactor further includes a collar retention structure. The collar retention structure is located in the probe hole between a retention hook of the removable probe collar and a ledge included in the removable signal probe collar. Consistent with the disclosed embodiments, in some embodiments, the contactor further includes a test system including a test signal source and a device under test. The contactor is coupled to the test signal source and to the device under test.

Consistent with the disclosed embodiments, a method for retrofitting a contactor is disclosed. The method includes removing an original equipment signal probe and any insulating material from the contactor, inserting a removable signal probe collar into the contactor, and inserting a signal probe into the contactor. The signal probe has an impedance and the removable signal probe collar enables tuning of the impedance.

In some embodiments, inserting the removable signal probe collar into the contactor includes inserting a snap-in removable signal probe collar into the contactor.

Consistent with the disclosed embodiments, a method includes forming a plurality of removable probe collars on a carrier structure. In some embodiments, the method further includes automatically inserting at least one of the plurality of removable probe collars into a contactor during manufacture of the contactor. In some embodiments, the method further includes automatically inserting a signal probe into the contactor after automatically inserting the at least one of the removable probe collars. In some embodiments, the method further includes automatically inserting at least one of the plurality of removable probe collars into a contactor during manufacture of the contactor.

Consistent with the disclosed embodiments, a removable signal probe collar includes a substantially cylindrical substrate having a cylinder axis. The substantially cylindrical substrate has a hole substantially aligned with the cylinder axis. The substantially cylindrical substrate has a slot substantially aligned with the cylinder axis. The slot divides the substantially cylindrical substrate into a first slot portion and a second slot portion. The first slot portion includes a first retention structure and the second slot portion includes a second retention structure. In some embodiments, in the removable signal probe collar the first retention structure includes a snap in retention structure. In some embodiments, in the removable signal probe collar the second retention structure includes a screw in retention structure. In some embodiments, in the removable signal probe collar the first retention structure and the second retention structure provide for a press fit of the removable signal probe collar with a contactor.

Consistent with the disclosed embodiments, a removable signal probe collar includes a substantially cylindrical substrate having a cylinder axis. The substantially cylindrical substrate has a hole substantially aligned with the cylinder axis. And the substantially cylindrical substrate has an outer surface including a groove encircling the substantially cylindrical substrate.

In some embodiments, the substantially cylindrical substrate comprises a compressible material. In some embodiments, the compressible material has an elastic modulus of between about 2000 MPa and about 3300 MPa. In some embodiments, the compressible material has a dielectric constant of between about 3 and about 4 at 10 GHz.

Consistent with the disclosed embodiments, a contactor includes a metal substrate having a probe hole, a first removable signal probe collar located in the probe hole, a second removable signal probe collar located in the probe hole, and a signal probe inserted into the first removable signal probe collar hole and into the second removable signal probe collar hole. The first removable signal probe collar has a first removable signal probe collar hole. The second removable signal probe collar has a second removable signal probe collar hole.

In some embodiments, the probe hole includes a first finger structure to enable snap-in of the first removable signal probe collar in the probe hole and a second finger structure to enable snap-in of the second removable signal probe collar in the probe hole. In some embodiments, the first removable signal probe collar includes a substantially cylindrical substrate having a cylinder axis. The substantially cylindrical substrate has a hole substantially aligned with the cylinder axis, and the substantially cylindrical substrate has an outer surface including a groove encircling the substantially cylindrical substrate. The groove enables snap-in of a probe collar to the probe hole and substantially locks the first removable signal probe collar to the first finger structure.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DETAILED DESCRIPTION

Reference will now be made in detail to the exemplary embodiments of the present disclosure described below and illustrated in the accompanying drawings. Wherever possible, the same reference numbers will be used throughout to refer to same or like parts.

While the present invention is described herein with reference to illustrative embodiments for particular applications, it should be understood that the invention is not limited thereto. Those having ordinary skill in the art and access to the teachings provided herein will recognize additional modifications, applications, embodiments, and substitution of equivalents, that all fall within the scope of the disclosure. Accordingly, the disclosure is not to be considered as limited by the foregoing or following descriptions.

Aspects relate to an apparatus and method for use in testing semiconductor devices. In semiconductor test systems for testing integrated circuits, a contactor houses signal and ground probes and provides an interface between a test signal source and the semiconductor device under test. The contactor normally includes signal probes and ground probes that couple a test signal from a test signal source to the integrated circuit under test. The physical arrangement and spacing of the signal probes and ground probes within the contactor is dictated by the layout of signal and ground contacts on the semiconductor device being tested. In some circumstances, the spacing between the signal and ground contacts is irregular resulting in impedance mismatches between the test signal source and the semiconductor device under test. Impedance mismatches can cause unintended signals to be delivered to the device under test, resulting in testing errors.

Embodiments relate to a removable signal probe collar that acts as an insulator and mounts to signal probes within a contactor. In addition, if a single collar becomes damaged during use of the contactor, it can be replaced by removing the collar from the signal probe and replacing it with a new collar. In some embodiments, the removable signal probe collar has a retention structure that maintains the signal probe collar within the contactor. For example, the retention structure may be a snap-in retention structure, a screw-in retention structure, or a press fit retention structure. Any type of retention structure which is configured to removably retain the signal probe collar within the contactor is contemplated by the present invention.

Figure 1:
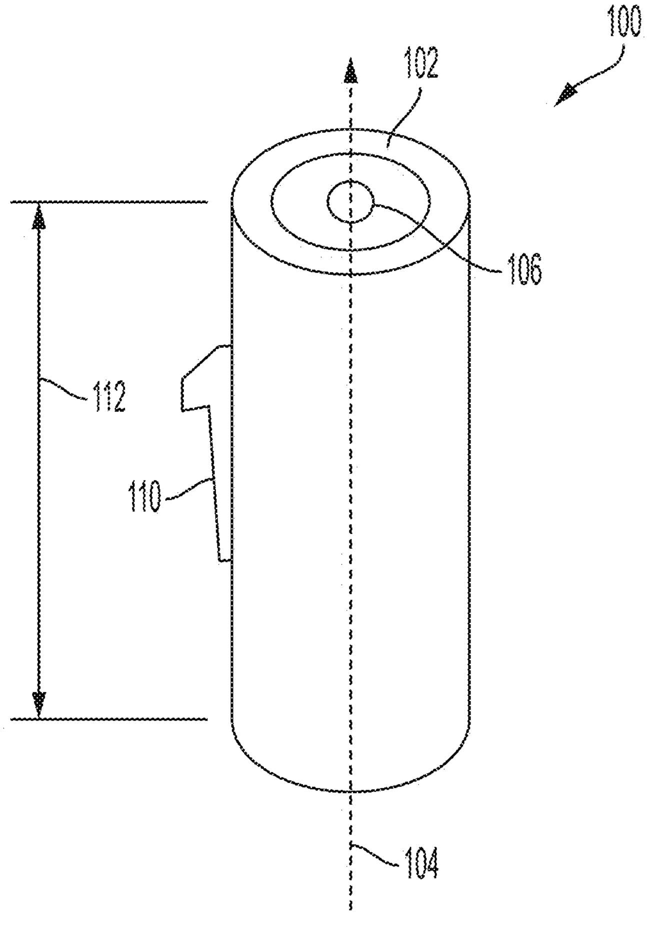
FIG. 1 shows an illustration of a removable signal probe collar including a probe alignment aperture in accordance with some embodiments of the present disclosure.

FIG. 1 shows an illustration of a removable signal probe collar 100 including a probe hole 106 in accordance with some embodiments of the present disclosure. The removable signal probe collar 100 includes a substantially cylindrical substrate 102 having a cylinder axis 104. The hole 106 is substantially aligned with the cylinder axis 104 and provides an alignment aperture to align a signal probe to a contactor when a signal probe is inserted into the signal probe collar 100 and the signal probe collar 100 is inserted into the contactor. In some embodiments, the probe is centrally aligned along the cylindrical axis 104 within the probe hole 106.

The substantially cylindrical substrate 102 includes a dielectric insulator. Examples of insulator materials suitable for use in the fabrication of the substantially cylindrical substrate 102 include, but are not limited to, liquid crystal polymers (LCP), polycarbonates, and polyetherimide. Methods of manufacture suitable for the fabrication of the substantially cylindrical substrate 102 include machining and turning. In some embodiments, the substantially cylindrical substrate 102 includes a retention structure 110, such as a snap-in retention structure (described below). Other retention structures include, but are not limited, to screw in or threaded retention structures and press fit retention structures. The substantially cylindrical substrate 102 has a height 112. The substantially cylindrical substrate 102 is not limited to a particular height. In some embodiments, the height 112 is between about 0.4 millimeters and about 1.5 millimeters. In some embodiments, the height 112 is about 0.5 millimeters.

In operation, the removable signal probe collar 100 is included in a contactor (shown in FIG. 3A below) having a signal probe. The removable signal probe collar 100 surrounds the signal probe that couples a test system signal source to a device under test, such as an integrated circuit. The removable signal probe collar 100 isolates the signal and provides for control of the impedance for the signal probe included in the contactor. Shielding is provided by the metal contactor. In some embodiments, the height 112 is selected to further tune the impedance.

Figure 2:
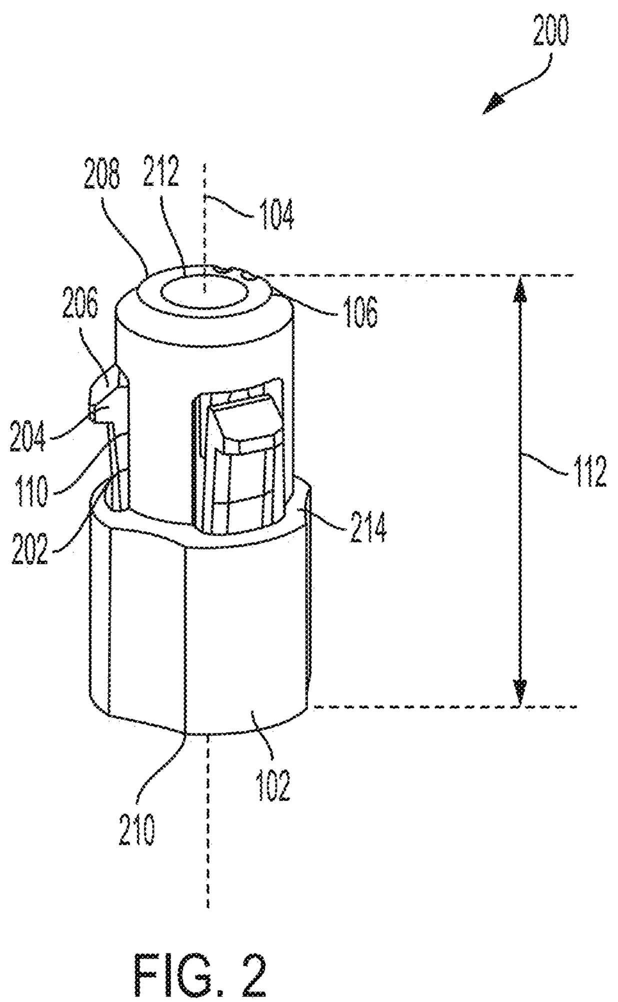
FIG. 2 shows an illustration of a removable signal probe collar including a retention structure in accordance with some embodiments of the present disclosure.

FIG. 2 shows an illustration of a removable signal probe collar 200 including a retention structure 110 in accordance with some embodiments of the present disclosure. The removable signal probe collar 200 includes a substantially cylindrical substrate 102 having a cylinder axis 104. The substantially cylindrical substrate 102 has a hole 106 substantially aligned with the cylinder axis 104. The substantially cylindrical substrate 102 includes the retention structure 110.

The substantially cylindrical substrate 102 includes a dielectric insulator. Examples of materials suitable for use in the fabrication of the substantially cylindrical substrate 102 include, but are not limited to, liquid crystal polymers (LCP), and polycarbonates. Fabrication methods suitable for manufacturing the substantially cylindrical substrate 102 is not limited to a particular method. Machining is one method suitable for use in the fabrication of the substantially cylindrical substrate 102.

In some embodiments, the substantially cylindrical substrate 102 includes a retention structure 110, such as a spring retention feature 202 including a retention hook 204. The spring retention feature 202 including the retention hook 204 is sometimes referred to as a snap-in retention structure. Upon insertion, the spring retention feature 202 flexes to enable insertion of the cylindrical substrate into a probe hole in a contactor. In some embodiments, the spring retention feature 202 is aligned substantially parallel to the cylinder axis 104. The retention hook 204 includes a sloped surface 206. The sloped surface facilitates insertion of the removable signal probe collar 200 into a probe hole in a contactor. The retention structure 110 is not limited to the retention hook 204. The retention structure 110 may also include a screw-in retention structure. A screw-in structure includes a threaded substantially cylindrical substrate 102 and a threaded probe hole of a contactor into which the removable signal probe collar 200 is to be inserted. Alternatively, the retention structure 110 may be realized by designing the cylindrical substrate 102 for a press fit with the probe hole of a contactor into which the removable signal probe collar 200 is to be inserted.

The substantially cylindrical substrate 102 has a height 112. The substantially cylindrical substrate 102 is not limited to a particular height. In some embodiments, the height 112 is between about 0.4 millimeters and about 1.5 millimeters. In some embodiments, the height 112 is about 0.5 millimeters. The substantially cylindrical substrate 102 has a proximal end 208 and a distal end 210. The proximal end 208 includes a probe alignment aperture 212 included in the hole 106. The probe alignment aperture 212 enables alignment of the probe alignment aperture 212 with a contact, such as a solder ball contact in a ball grid array of an integrated circuit. In some embodiments, the removable signal probe collar 200 includes a ledge 214 formed on the substantially cylindrical substrate 102.

In operation, the removable signal probe collar 200 is included in a contactor having a signal probe. The removable signal probe collar 200 surrounds the signal probe that couples a test system signal source to a device under test, such as an integrated circuit. The removable signal probe collar 200 provides impedance tuning for the signal probe included in the contactor. In some embodiments, the height 112 is selected to tune the impedance for the signal probe. In some embodiments, the signal probe is tuned to an impedance of 35, 45, 50, or 85 ohms. In some embodiments, the signal probe collar 200 provides shielding. In operation, the probe alignment aperture 212 substantially aligns a probe in a contactor to a contact site of a device under test.

Figure 3A:
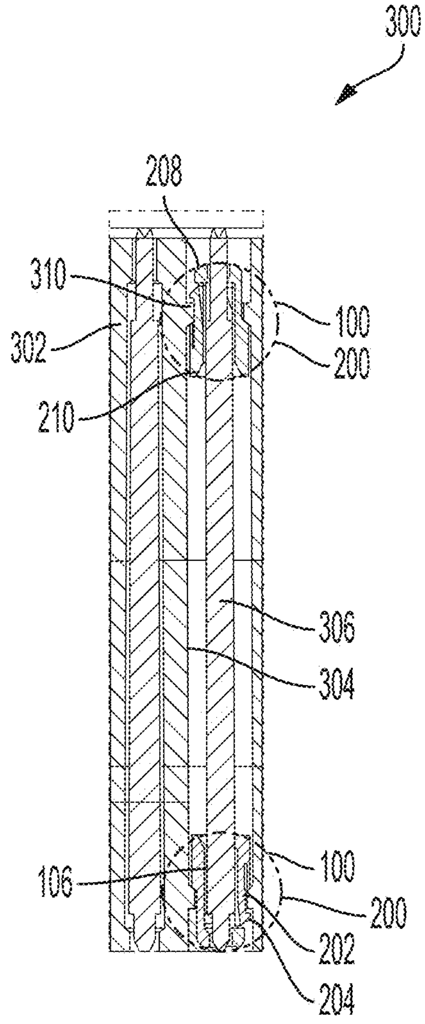
FIG. 3A shows a cross-sectional illustration of a contactor including the removable signal probe collar (shown in FIG. 1 and FIG. 2) in accordance with some embodiments of the present disclosure.

FIG. 3A shows an illustration of a contactor 300 including the removable signal probe collar 100 or the removable signal probe collar 200 in accordance with some embodiments of the present disclosure. The contactor 300 includes a metal substrate 302 having a probe hole 304. The removable signal probe collar 100 or the removable signal probe collar 200 is located in the probe hole 304. The removable signal probe collar 100 and the removable signal probe collar 200 and the removable signal probe collar 700 (shown in FIG. 7 below) each include a removable signal probe collar hole 106. The contactor 300 further includes a signal probe 306 located in the removable probe collar hole 106.

In some embodiments, for example, as shown in FIG. 2, the removable signal probe collar 200 has a proximal end 208 and a distal end 210. The proximal end 208 includes a signal probe alignment aperture 212 shown in FIG. 2. The signal probe alignment aperture 212 enables alignment of the signal probe 306 to a contact site, such as a solder ball or metal sphere in a ball grid array of a device under test. In some embodiments, the signal probe alignment aperture 212 has a diameter substantially equal to the diameter of the solder ball or metal sphere of the ball grid array. In some embodiments, the removable signal probe collar 200 includes a snap-in removable signal probe collar. The snap-in signal probe collar includes a spring retention feature 202 including a retention hook 204, also shown in FIG. 2.

Figure 3B:
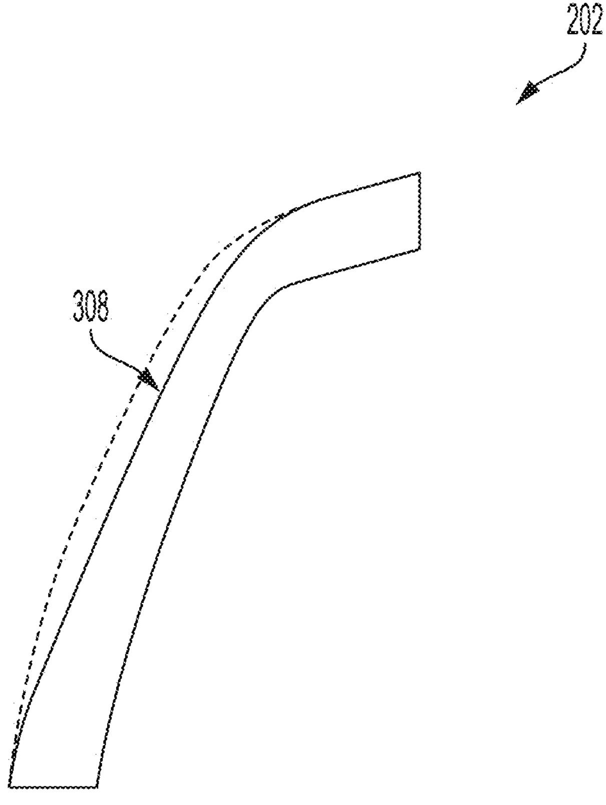
FIG. 3B shows an illustration of a spring retention feature in accordance with some embodiments of the present disclosure.

FIG. 3B shows an illustration of a spring retention feature 202 in accordance with some embodiments of the present disclosure. The spring retention feature 202 includes a surface 308 that is back cut to substantially prevent the spring retention feature 202 from binding the signal probe 306 (shown in FIG. 3A) when the spring retention feature 202 is partially deflected while being inserted into the probe hole 304 of the contactor 300 shown in FIG. 3A.

Referring again to FIG. 3A, in some embodiments, the contactor 300 includes a finger structure 310. The finger structure 310 is located in the probe hole 304 between the retention hook 204 of the removable signal probe collar 200 and a ledge 214 (shown in FIG. 2) included in the removable signal probe collar 100 or the removable signal probe collar 200 or the removable signal probe collar 700 (see FIG. 7).

Figure 4:
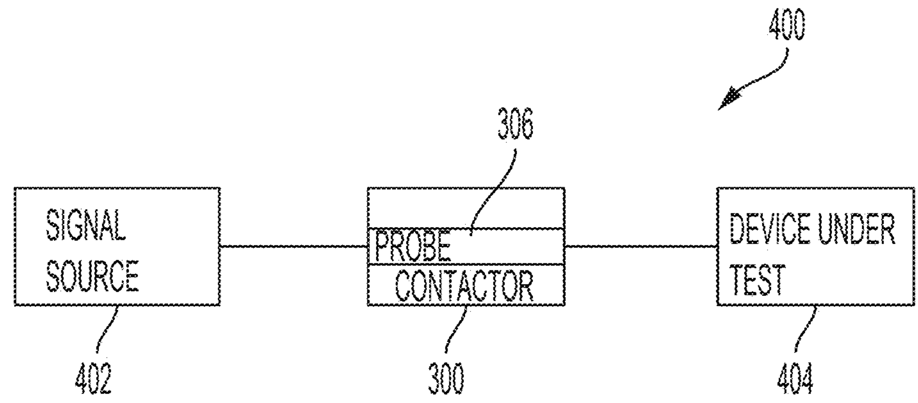
FIG. 4 shows a block diagram of a test system in accordance with some embodiments of the present disclosure.

In operation, the contactor 300 connects a signal source in a test system to a device under test, such as an integrated circuit (see FIG. 4). The signal probe 306 included in the contactor 300 couples a test signal from the signal source to the device under test. The removable signal probe collar 100 or the removable signal probe collar 200 can be used to tune the impedance of the signal probe 306. The contactor 300 shields the signal probe 306 from noise, such as cross-talk noise, generated from signals transmitted through other probes included in the contactor 300.

FIG. 4 shows a block diagram of a test system 400 in accordance with some embodiments of the present disclosure. The test system 400 includes a signal source 402, a device under test 404, and a contactor 300. The contactor 300 connects the signal source 402 to the device under test 404. In operation, the contactor 300 couples a signal from the signal source 402 to the device under test 404. More particularly, the signal probe 306 (shown in FIG. 3), which is included in the contactor 300, couples a test signal provided by the signal source 402 to the device under test 404.

Figure 5:
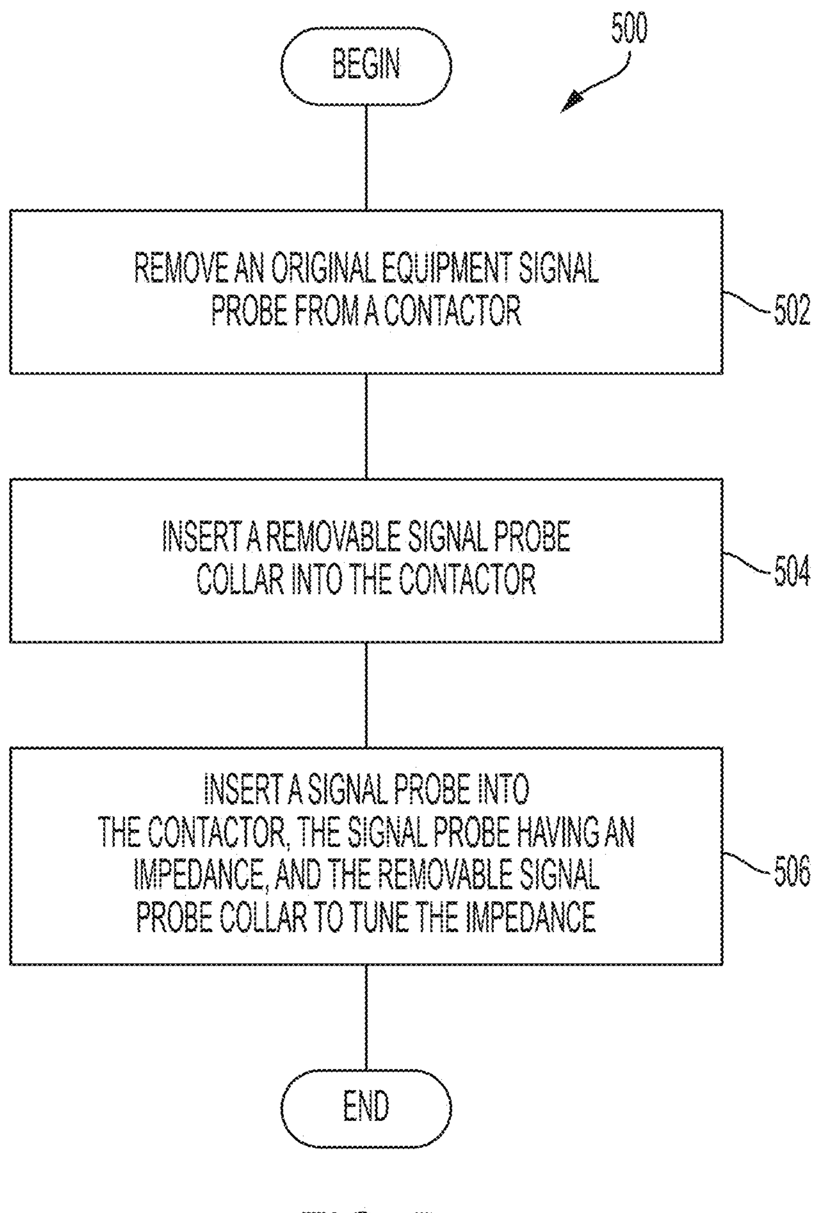
FIG. 5 shows a flow diagram of a method for retrofitting a contactor in accordance with some embodiments of the present disclosure.

FIG. 5 shows a flow diagram of a method 500 for retrofitting a contactor in accordance with some embodiments of the present disclosure. Contactors, both contactors designed with the removable signal probe collar 100 or the removable signal probe collar 200 or the removable signal probe collar 700 (shown in FIG. 7) and those that were not designed with the removable signal probe collar 100 or the removable signal probe collar 200 or the removable probe collar 700, can be repaired or maintained by replacing a signal probe and adding or replacing a signal probe collar at the time of maintenance. Further, an original collar that was designed to be removed or not removed can be repaired or maintained by adding or replacing the original collar at the time of maintenance. The method 500 includes removing an original equipment signal probe and any insulating material from the contactor (block 502), inserting a removable signal probe collar into the contactor (block 504), and inserting a signal probe into the contactor, the signal probe having an impedance, and the removable signal probe collar to tune the impedance (block 506). In some embodiments, inserting the removable signal probe collar into the contactor comprises inserting a snap-in removable signal probe collar into the contactor. In some embodiments, inserting the removable signal probe collar into the contactor comprises inserting a screw-in removable signal probe collar into the contactor. In some embodiments, inserting the removable signal probe collar into the contactor comprises inserting a press-fit removable signal probe collar into the contactor.

Figure 6:
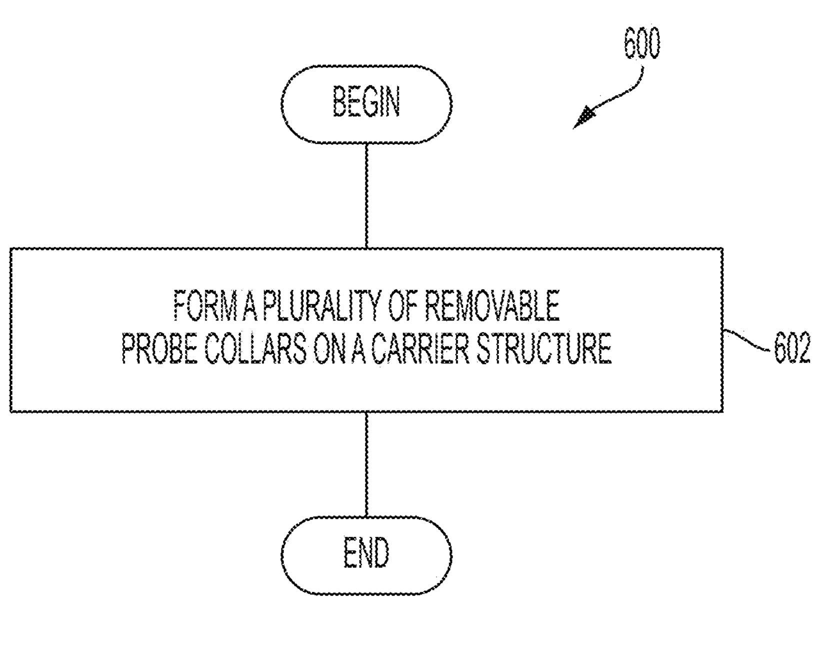
FIG. 6 shows a flow diagram for a method including forming a plurality of removable probe collars on a carrier structure in accordance with some embodiments of the present disclosure.

FIG. 6 shows a flow diagram for a method 600 including forming a plurality of removable probe collars on a carrier structure (block 602). In some embodiments, the method 600 further includes automatically inserting at least one of the plurality of removable probe collars into a contactor during manufacture of the contactor. In some embodiments, the method 600 further includes automatically inserting a signal probe into the contactor after automatically inserting the at least one of the removable probe collars. In some embodiments, the plurality of removable probe collars are formed by a molding process.

Figure 7A:
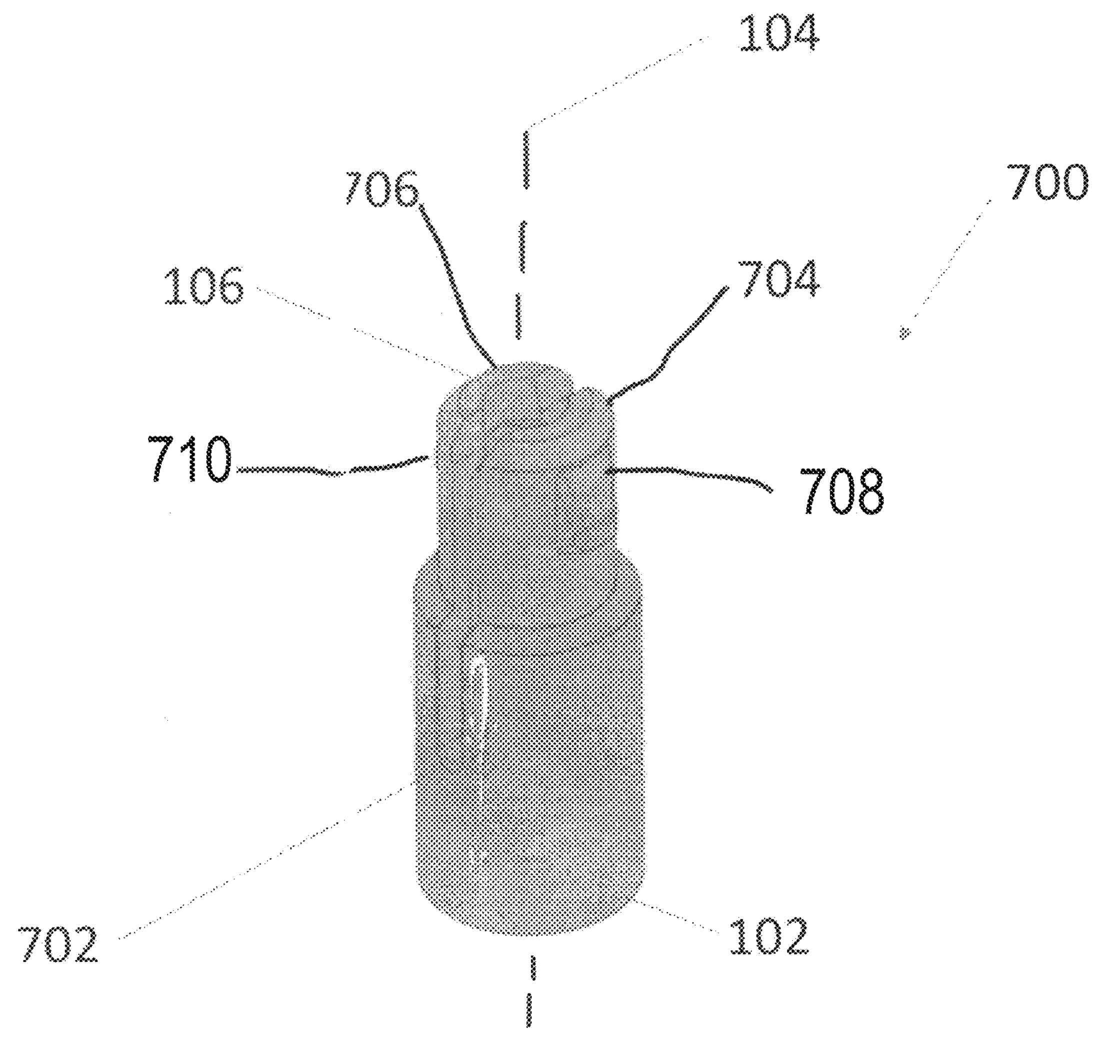
FIG. 7A shows an illustration of a removable signal probe collar including a slot in accordance with some embodiments of the present disclosure.

FIG. 7A shows an illustration of a removable signal probe collar 700 including a slot 702 in accordance with some embodiments of the present disclosure. The removable signal probe collar 700 includes a substantially cylindrical substrate 102 having a cylinder axis 104. The substantially cylindrical substrate 102 has a hole 106 substantially aligned with the cylinder axis 104. The substantially cylindrical substrate 102 includes the slot 702 substantially aligned with the cylinder axis 104. The slot 702 divides the substantially cylindrical substrate 102 into a first slot portion 704 and a second slot portion 706. The first slot portion 704 includes a first retention structure 708 and the second slot portion 706 includes a second retention structure 710. In some embodiments, in the removable signal probe collar 700 the first retention structure 708 includes a snap-in retention structure. The spring retention feature 202 including the retention hook 204 is sometimes referred to as a snap-in retention structure. In some embodiments, for the signal probe collar 700, the second retention structure 710 includes a screw in or threaded retention structure. In some embodiments, in the removable signal probe collar 700, the first retention structure 708 and the second retention structure 710 provide for a press fit of the removable signal probe collar 700 with a contactor.

Figure 7B:
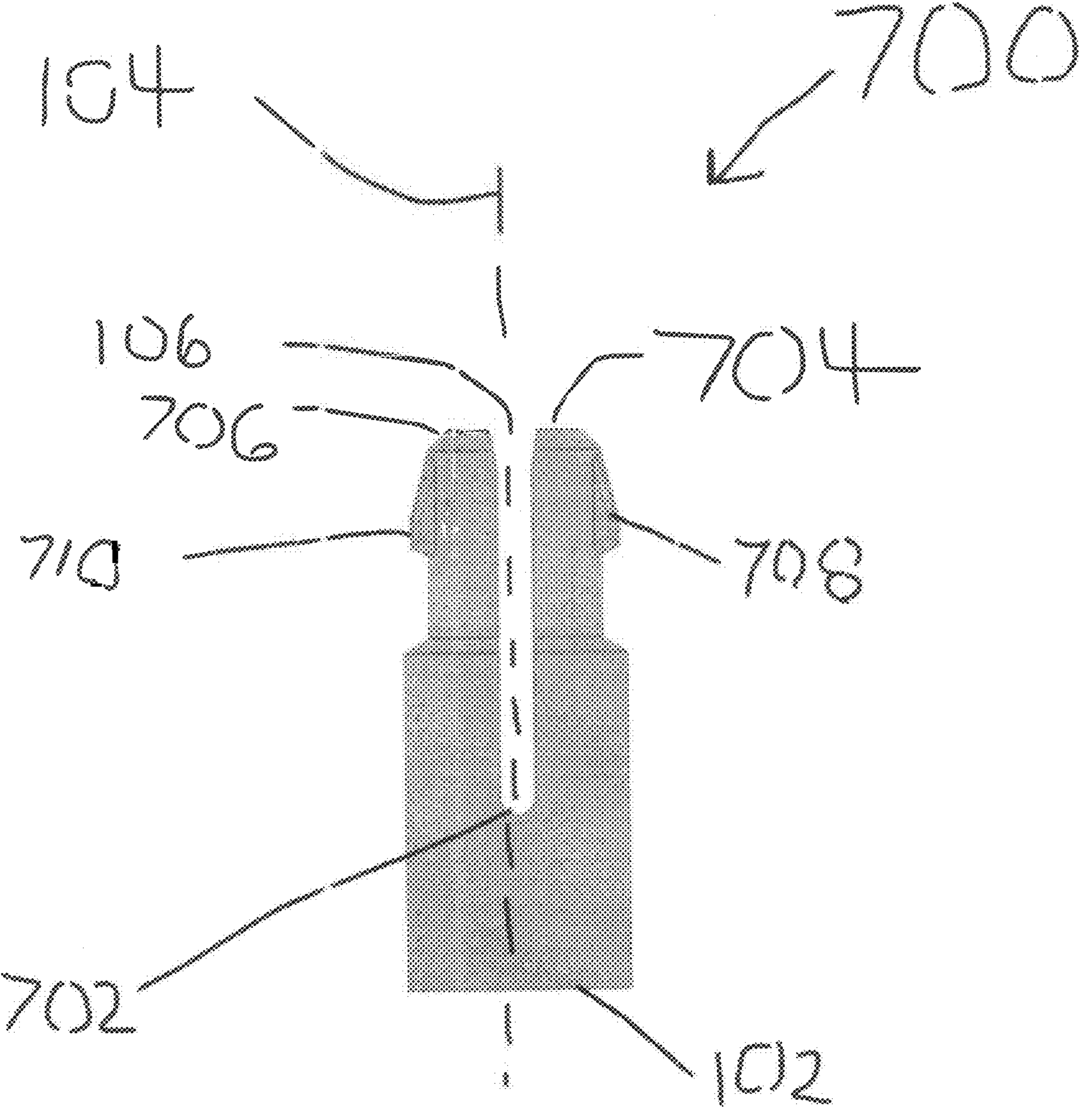
FIG. 7B shows an illustration cutaway side view of the removable signal probe collar shown in FIG. 7A in accordance with some embodiments of the present disclosure.

FIG. 7B shows an illustration cutaway side view of the removable signal probe collar 700 shown in FIG. 7A in accordance with some embodiments of the present disclosure. The removable signal probe collar 700 includes the substantially cylindrical substrate 102 having the cylinder axis 104. The substantially cylindrical substrate 102 has the hole 106 substantially aligned with the cylinder axis 104. The substantially cylindrical substrate 102 includes the slot 702 substantially aligned with the cylinder axis 104. The slot 702 divides the substantially cylindrical substrate 102 into the first slot portion 704 and a second slot portion 706. The first slot portion 704 includes the first retention structure 708 and the second slot portion 706 includes the second retention structure 710. In some embodiments, for the removable signal probe collar 700 the first retention structure 708 includes the snap-in retention structure. In some embodiments, for the signal probe collar 700, the second retention structure 710 includes the screw in or threaded retention structure. In some embodiments, in the removable signal probe collar 700, the first retention structure 708 and the second retention structure 710 provide for a press fit of the removable signal probe collar 700 with a contactor.

Figure 8A:
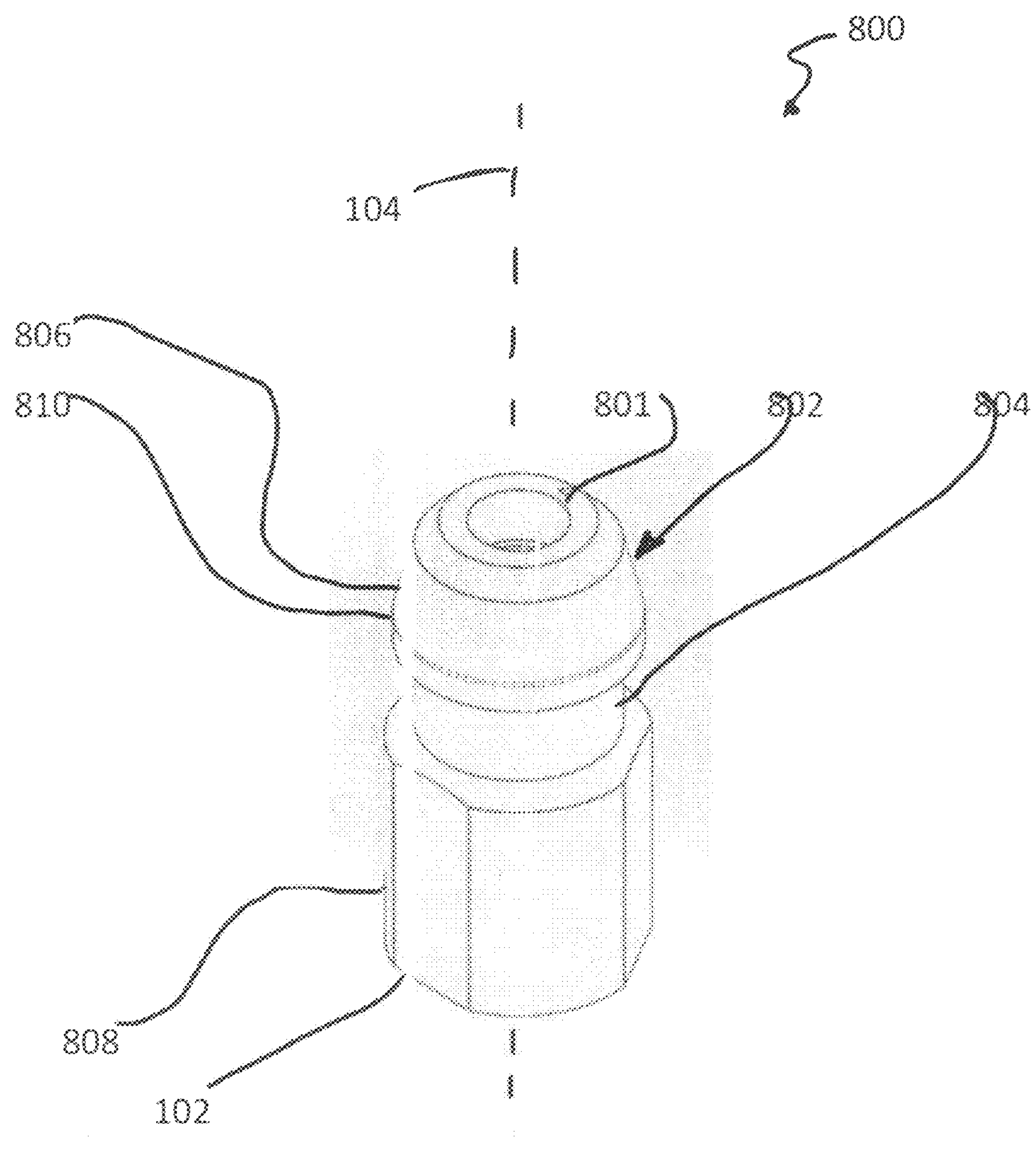
FIG. 8A shows a perspective view of a removable signal probe collar in accordance with some embodiments of the present disclosure.

FIG. 8A shows a perspective view of a removable signal probe collar 800 in accordance with some embodiments of the present disclosure. The removable signal probe collar 800 includes a substantially cylindrical substrate 102 having a cylinder axis 104. The substantially cylindrical substrate 102 has a hole 801 substantially aligned with the cylinder axis 104. The substantially cylindrical substrate 102 has an outer surface 802 including a groove 804 encircling the substantially cylindrical substrate 102. The substantially cylindrical substrate 102 includes an upper portion 806 and a lower portion 808 separated by the groove 804. The upper portion 806 includes a ring 810 that identifies a location of the maximum diameter of the removable signal probe collar 800. In some embodiments, the substantially cylindrical substrate 102 includes a compressible material. In some embodiments, the compressible material has an elastic modulus of between about 2000 MPa and about 3300 MPa. In some embodiments, the compressible material has a dielectric constant of between about 3 and about 4 at 10 GHz.

Figure 8B:
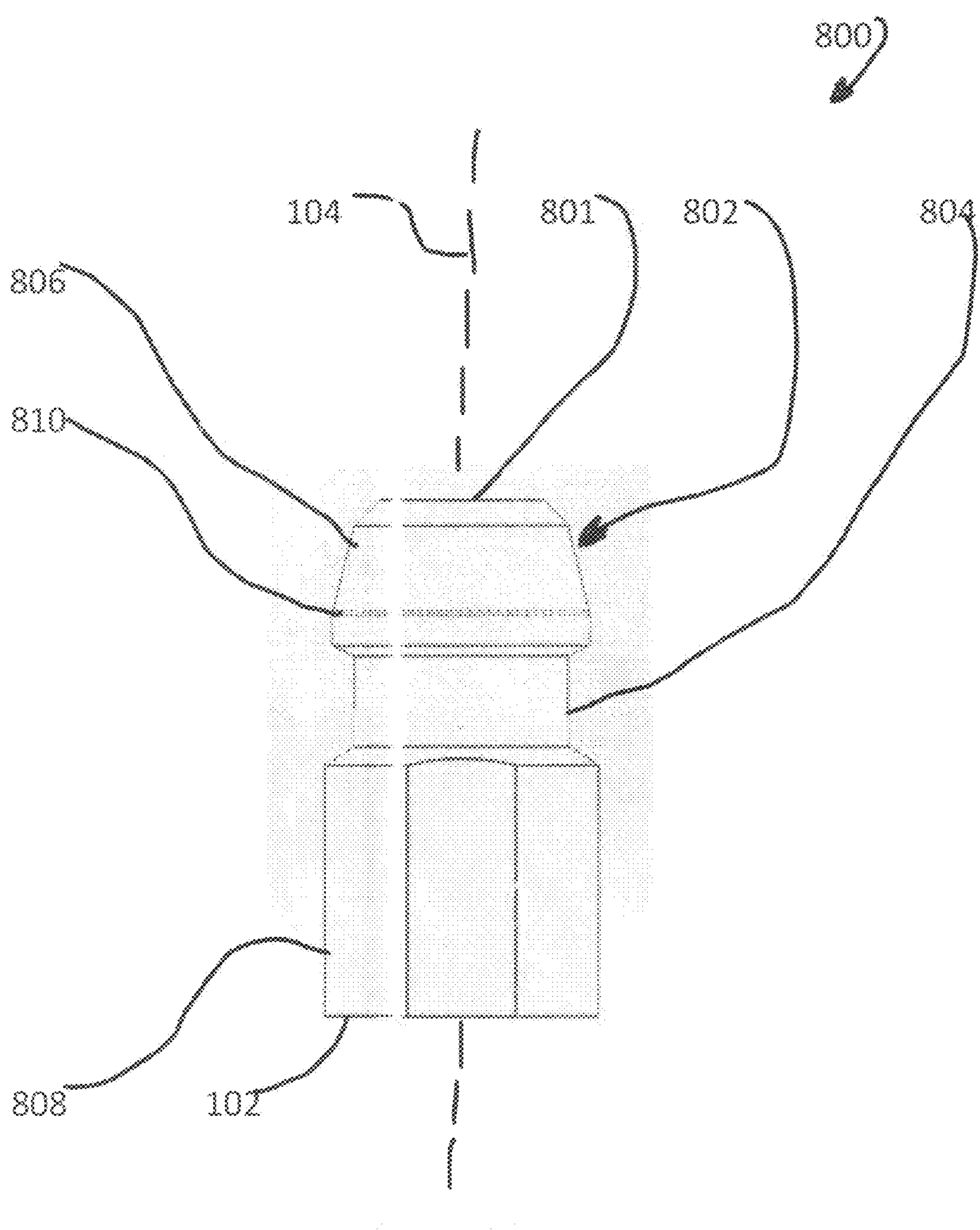
FIG. 8B shows a side view of the removable signal probe collar shown in FIG. 8A in accordance with some embodiments of the present disclosure.

FIG. 8B shows a side view of the removable signal probe collar 800 shown in FIG. 8A in accordance with some embodiments of the present disclosure. The removable signal probe collar 800 includes the substantially cylindrical substrate 102 having the cylinder axis 104. The substantially cylindrical substrate 102 has the hole 801 substantially aligned with the cylinder axis 104. The substantially cylindrical substrate 102 has the outer surface 802 including the groove 804 encircling the substantially cylindrical substrate 102. The substantially cylindrical substrate 102 includes an upper portion 806 and a lower portion 808 separated by the groove 804. The upper portion includes the ring 810 that identifies a location of the maximum diameter of the removable signal probe collar 800.

Figure 9:
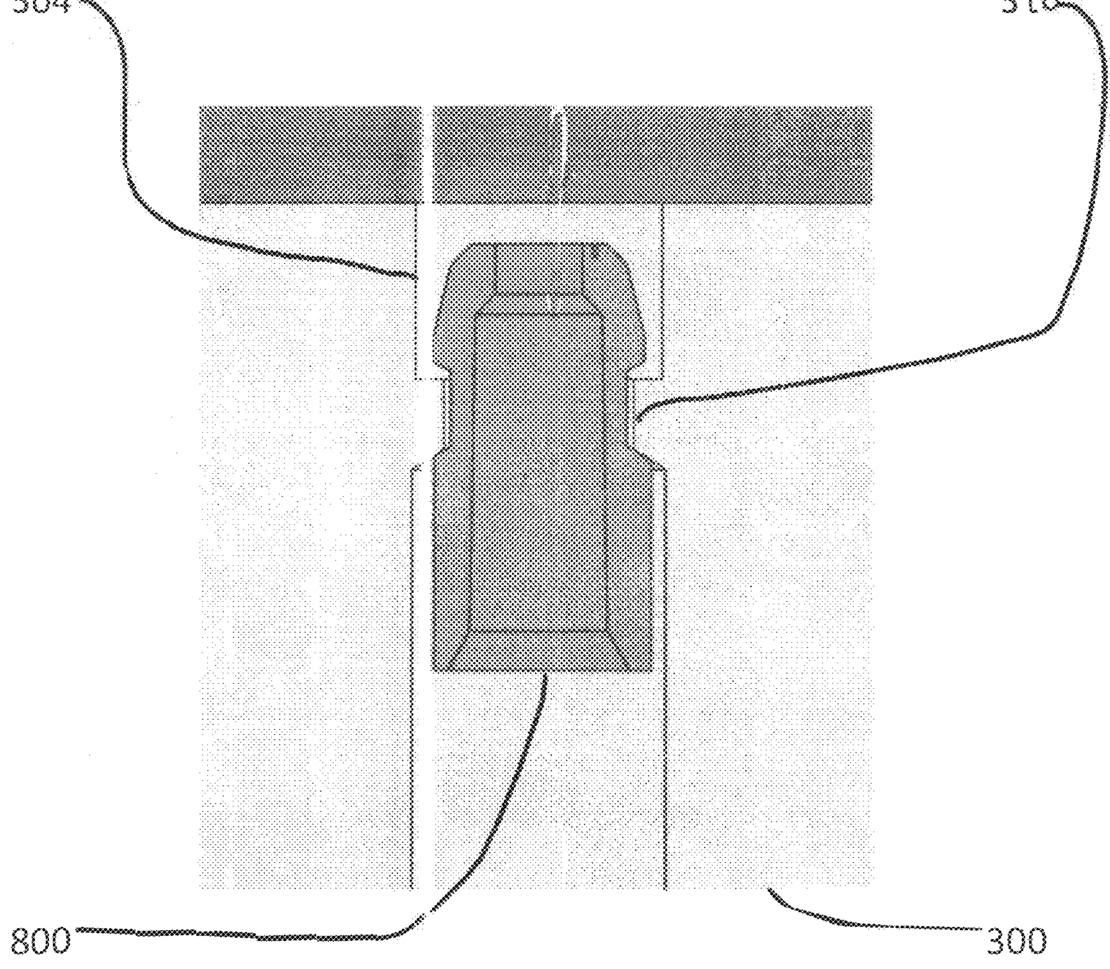
FIG. 9 shows a cross-sectional side view of the removable signal probe collar, shown in FIG. 8A, inserted in a probe hole in accordance with some embodiments of the present disclosure.

FIG. 9 shows a cross-section side view of the removable signal probe collar 800, shown in FIG. 8A, inserted in a probe hole 304 in accordance with some embodiments of the present disclosure. The probe hole 304 includes a finger structure 310 to enable snap-in of the removable signal probe collar 800 into the probe hole 304 of the contactor 300.

Figure 10:
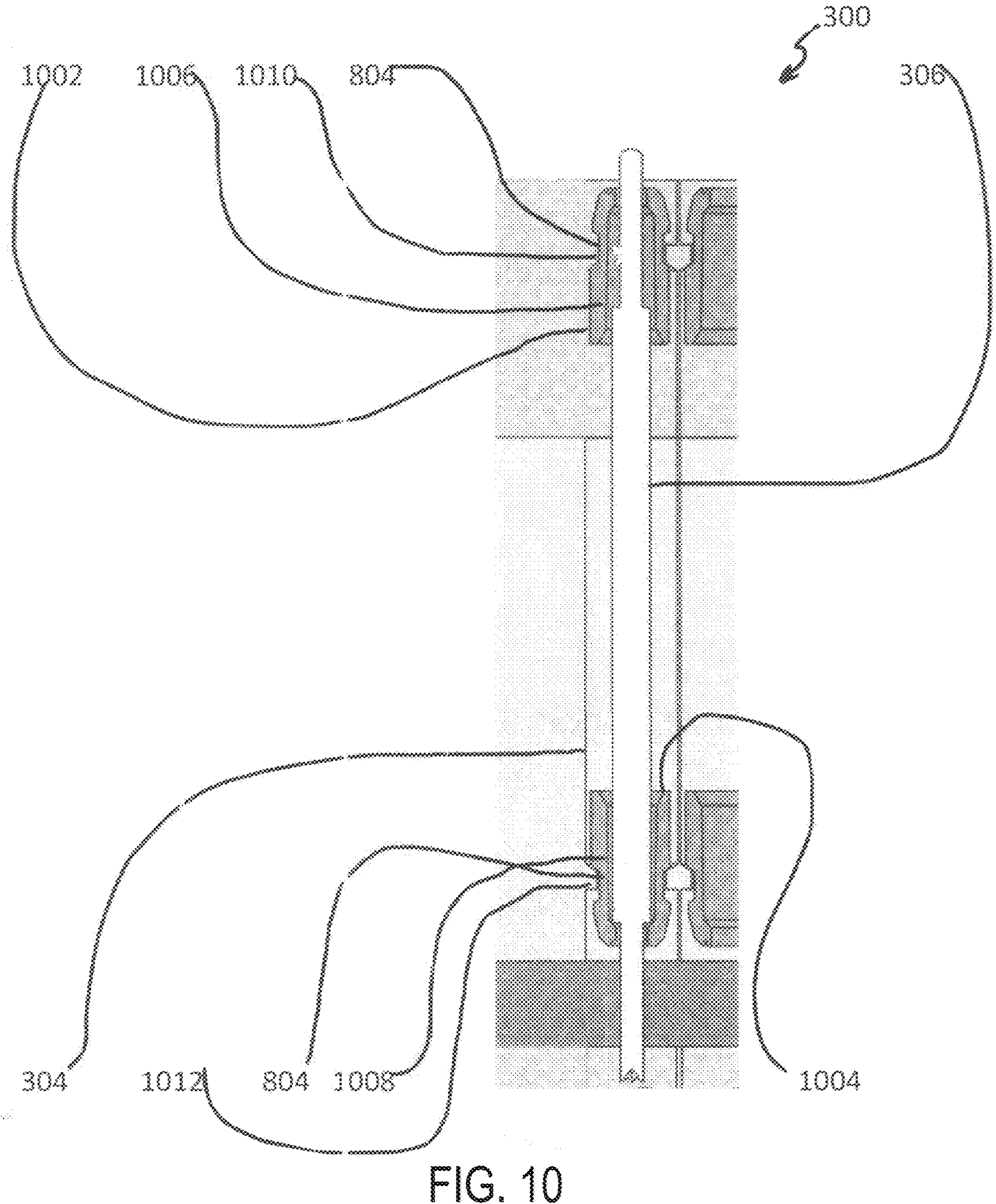
FIG. 10 shows a cross-sectional side view of a contactor 300 in accordance with some embodiments of the present disclosure.

FIG. 10 shows a cross-sectional side view of a contactor 300 in accordance with some embodiments of the present disclosure. The contactor 300 includes the probe hole 304. In some embodiments, the contactor 300 is formed from a metal. A first removable signal probe collar 1002 is located in the probe hole 304. A second removable signal probe collar 1004 is located in the probe hole 304. The first removable signal probe collar 1002 has a first removable signal probe collar hole 1006. The signal probe 306 is inserted into the first removable signal probe collar hole 1006. The second removable signal probe collar 1004 has a second removable signal probe collar hole 1008. The signal probe 306 is inserted into the second removable signal probe collar hole 1008. In some embodiments, the probe hole 304 includes a first finger structure 1010 to enable snap-in of the first removable signal probe collar 1002 in the probe hole 304 and a second finger structure 1012 to enable snap-in of the second removable signal probe collar 1008 in the probe hole 304. In some embodiments, the first finger structure 1010 and the second finger structure 1012 are a ring shaped structure, or annulus, formed within the probe hole 304 and protrude from the wall of the probe hole 304. Of course, it should be realized that the contactor may have more than two finger structures for retaining the collar within the contactor. For example, collars with 3, 4, 5, 6, or more finger structures are contemplated.

In some embodiments, the first removable signal probe collar 1002 is the removable signal probe collar 300 shown in FIG. 8A. Upon insertion into the probe hole 304, the groove 804 encircling the substantially cylindrical substrate 102 (shown in FIG. 8A) mates or snaps-in with first finger structure 1010 and substantially locks the first removable signal probe collar 1002 to the first finger structure 1010.

In some embodiments, the second removable signal probe collar 1004 is the removable signal probe collar 300 shown in FIG. 8A. Upon insertion into the probe hole 304, the groove 804 encircling the substantially cylindrical substrate 102 (shown in FIG. 8A) mates or snaps-in with the second finger structure 1012 and substantially locks the second removable signal probe collar 1004 to the second finger structure 1012.

Reference throughout this specification to "an embodiment," "some embodiments," or "one embodiment." means that a particular feature, structure, material, or characteristic described in connection with the embodiment is included in at least one embodiment of the present disclosure. Thus, the appearances of the phrases such as "in some embodiments," "in one embodiment," or "in an embodiment," in various places throughout this specification are not necessarily referring to the same embodiment of the present disclosure. Furthermore, the particular features, structures, materials, or characteristics may be combined in any suitable manner in one or more embodiments.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the disclosure.

What is claimed is:

1. A removable signal probe collar for mounting a signal probe to a contactor, comprising:
- a substantially cylindrical substrate having a cylinder axis;
- a hole in the substantially cylindrical substrate aligned with the cylinder axis;
- a probe aperture; and
- a retention structure configured to maintain the removable signal probe collar in the contactor, wherein the retention structure is selected from the group consisting of a snap-in retention structure, a screw-in retention structure and a press fit retention structure.

2. The removable signal probe collar of claim 1, wherein the probe aperture is configured to align the signal probe within the probe aperture.

3. The removable signal probe collar of claim 1, wherein the substantially cylindrical substrate has a height of between about 0.4 millimeters and about 1.5 millimeters.

4. The removable signal probe collar of claim 1, wherein the retention structure comprises a spring retention feature including a retention hook.

5. The removable signal probe collar of claim 4, wherein the spring retention feature is aligned substantially parallel to the cylinder axis.

6. The removable signal probe collar of claim 4, wherein the spring retention feature includes a surface that is back cut to substantially prevent the spring retention feature from binding the signal probe when the spring retention feature is partially deflected.

7. The removable signal probe collar of claim 1, wherein the substantially cylindrical substrate comprises a slot substantially aligned with the cylinder axis, the slot dividing the substantially cylindrical substrate into a first slot portion and a second slot portion.

8. The removable signal probe collar of claim 7, wherein the first slot portion comprises a first retention structure and the second slot portion comprises a second retention structure.

9. The removable signal probe collar of claim 1, further comprising an outer surface including a groove encircling the substantially cylindrical substrate.

10. The removable signal probe collar of claim 1, wherein the substantially cylindrical substrate comprises a compressible material.

11. The removable signal probe collar of claim 10, wherein the compressible material has an elastic modulus of between about 2000 MPa and about 3300 MPa.

12. The removable signal probe collar of claim 10, wherein the compressible material has a dielectric constant of between about 3 and about 4 at 10 GHz.

13. A contactor comprising:

a metal substrate having a probe hole;

a first removable signal probe collar located in the probe hole, the first removable signal probe collar having a first removable signal probe collar hole;

a second removable signal probe collar located in the probe hole, the second removable signal probe collar having a second removable signal probe collar hole;

a signal probe inserted into the first removable signal probe collar hole and into the second removable signal probe collar hole; and wherein the first removable signal probe collar comprises a retention structure configured to maintain the first removable signal probe collar in the contactor, wherein the retention structure is selected from the group consisting of a snap-in retention structure, a screw-in retention structure and a press fit retention structure.

14. The contactor of claim 13, wherein the probe hole includes a first finger structure to enable snap-in of the first removable signal probe collar in the probe hole and a second finger structure to enable snap-in of the second removable signal probe collar in the probe hole.

15. The contactor of claim 14, wherein the first removable signal probe collar comprises a substantially cylindrical substrate having a cylinder axis, the substantially cylindrical substrate having a hole substantially aligned with the cylinder axis.

16. The contactor of claim 15, wherein the substantially cylindrical substrate has an outer surface including a groove encircling the substantially cylindrical substrate.

17. The contactor of claim 16, wherein the groove is configured to snap-in and substantially lock the first removable signal probe collar to the first finger structure.

18. A method for retrofitting a contactor, the method comprising:

removing an original equipment signal probe and any insulating material from the contactor;

inserting a removable signal probe collar into the contactor; and inserting a signal probe into the contactor, the signal probe having an impedance, and the removable signal probe collar to tune the impedance.

19. The method of claim 18, wherein inserting the removable signal probe collar into the contactor comprises inserting a snap-in removable signal probe collar into the contactor.

* * * * *